United States Patent [19]

Grinberg et al.

[11] 4,191,452
[45] Mar. 4, 1980

[54] AC SILICON PN JUNCTION PHOTODIODE LIGHT-VALVE SUBSTRATE

[75] Inventors: Jan Grinberg; Paul O. Braatz, both of Los Angeles; Michael Waldner, Woodland Hills; Alexander D. Jacobson, Los Angeles, all of Calif.

[73] Assignee: Hughes Aircraft Company, Culver City, Calif.

[21] Appl. No.: 865,281

[22] Filed: Dec. 28, 1977

[51] Int. Cl.² .............................................. G02P 1/13
[52] U.S. Cl. .................................... 350/342; 350/334; 357/24; 357/30
[58] Field of Search ..................... 350/332, 334, 342; 357/24, 30, 20

[56] References Cited

U.S. PATENT DOCUMENTS

| | | | |
|---|---|---|---|
| 3,976,361 | 8/1976 | Fraas et al. | 350/342 |
| 4,032,954 | 6/1977 | Grinberg et al. | 350/342 X |
| 4,093,357 | 6/1978 | Jacobson et al. | 350/342 X |

*Primary Examiner*—Edward S. Bauer
*Attorney, Agent, or Firm*—George Tacticos; W. H. MacAllister

[57] ABSTRACT

There is disclosed a single crystal silicon charge storage apparatus suitable for use in an alternating current driven liquid crystal light valve having therein a PIN photodiode structure. The charge storage medium is made of a high resistivity substrate on which an MOS capacitor is formed having fast photoelectric transient response an capable of operating over a wide frequency range. A PIN photodiode structure is provided on one side of the substrate next to the MOS capacitor to deplete the substrate of its mobile charge carriers during a portion of the AC cycle and to collect the electric field-guided signal representing charge carriers that are generated or introduced into the substrate by an input mechanism. The signal from the substrate is electrically coupled through high-reflectivity mirrors and light blocking layers to the liquid crystal.

14 Claims, 7 Drawing Figures

4,191,452

AC SILICON PN JUNCTION PHOTODIODE LIGHT-VALVE SUBSTRATE

FIELD OF THE INVENTION

This invention relates to a charge storage and transfer apparatus and more particularly to a semiconductor substrate with an MOS capacitor and diode arrangements for the storage and transfer of minority charge carriers representing signals to an alternating current driven liquid crystal light valve.

RELATED APPLICATIONS

In a copending U.S. patent application Ser. No. 4,107, filed on Jan. 17, 1979 as a continuation of abandoned U.S. patent application Ser. No. 792,842, filed on May 2, 1977, entitled "High Resolution Continuously Distributed Silicon Photodiode Substrate" by Grinberg et al and assigned to the present assignee, there is disclosed and generically claimed a semiconductor apparatus for the transfer of charge from one surface of a substrate to the opposite surface through the use of a space charge depletion region.

In another copending U.S. patent application Ser. No. 5,418 filed on Jan. 22, 1979 as a continuation of abandoned U.S. patent application Ser. No. 796,641, filed on May 13, 1977, entitled "Simple CCD Readout Scheme for Display Applications", by Grinberg et al and assigned to the present assignee, there is disclosed and generically claimed a semiconductor apparatus for the transfer of charge carriers from one surface of a substrate to the opposite surface through the use of a charge depletion region wherein the charge packets are initially stored under a set of CCD electrodes overlying an epitaxial layer formed on a surface of the substrate and then they are simultaneously transferred across the entire thickness of the substrate.

In another copending U.S. patent application Ser. No. 949,840, filed on Oct. 10, 1978 as a continuation of abandoned U.S. patent application Ser. No. 808,224, filed on June 20, 1977, entitled "Continuous Silicon MOS AC Light Valve Substrate", by Braatz et al, there is disclosed and generically claimed a semiconductor apparatus for the transfer of charge carriers under the influence of an AC electric field, across a substrate which is depleted of its mobile charge carriers during one portion of the AC bias cycle.

In still another copending U.S. patent application Ser. No. 967,444, filed on Dec. 7, 1978 as a continuation of abandoned U.S. patent application Ser. No. 834,856, filed on Sept. 19, 1977, entitled "High Resolution AC Silicon MOS Light-Valve Substrate", by Grinberg et al, there is disclosed and claimed an AC liquid crystal light valve having a high resistivity silicon substrate for the storage medium with an MOS type of capacitor for the formation of a depletion region in the substrate during a portion of the AC bias cycle and with a doped microgrid structure to provide a focusing electric field for the charge carriers.

BACKGROUND OF THE INVENTION

U.S. Pat. No. 3,824,002 issued to Terry D. Beard entitled "Alternating Current Liquid Crystal Light Valve" and assigned to the present assignee discloses the basic principles of operation of an alternating current liquid crystal light valve which requires that a photoconductor be impedance-matched to the liquid crystal, the photocapacitance of the photoconductor being modulated in response to an input light.

U.S. Pat. No. 3,976,361 issued to Fraas et al entitled "Charge Storage Diode with Graded Defect Density Photocapacitive Layer" and assigned to the present assignee discloses a different photoconductor for a similar light valve. The photoconductor consists of a charge storage semiconductor diode with a graded band gap layer increasing the optical absorption coefficient of the region near the rectifying junction to permit the storage of charge.

The aforementioned copending U.S. patent application Ser. No. 792,842, filed on May 2, 1977, discloses the use of a space charge depletion region to transfer field guided minority charge carriers representing signals from one surface of a substrate to the opposite surface using the charge depletion region as a transfer medium. The charges are DC driven and the depletion region in one embodiment is formed by reverse biasing a rectifying junction. As it was indicated in that application, minority charge carriers representing signals can be generated or injected into the storage and transfer medium through a variety of different means. One such means that was disclosed in that application, was the photogeneration of charge carriers inside the transfer medium. One application of the concept disclosed and claimed in the aforementioned patent application is in DC liquid crystal light valves.

The aforementioned copending U.S. patent application Ser. No. 796,641, filed on May 13, 1977 discloses and claims a structure wherein a CCD input register is used to accept and store the input charge and then transfer it out to activate a light display medium such as a liquid crystal layer. The charge packets, after their release from the control of the CCD control voltages, diffuse through a thin epitaxial layer and reach a relatively thick space charge depletion region through which they transfer under the influence of an electric field to the opposite side of the substrate. Such a structure can be used as a charge transfer medium for a DC liquid crystal light valve.

Some of the present photoactivated liquid crystal light valves, made according to the teachings of U.S. Pat. No. 3,976,361 use a thin film of cadmium sulphide which is driven with alternating current. The photodetector acts as a light activated voltage gate. The thin film structure is designed to accept the major portion of the drive voltage when the photoconductor is unilluminated; the portion of the voltage that falls across the liquid crystal is below the threshold for activation of the liquid crystal electro-optic effect. When light falls on the photoconductor, its impedance drops, thereby switching the voltage from the photoconductor onto the liquid crystal and driving the liquid crystal into its activated state. Due to the high lateral impedance of the thin films there is very little spread of the photogenerated signal and of its concomitant liquid crystal electro-optic effect. As a result, the light activation process is a high resolution process, so that the device can accept photographic quality images for transfer to an intense beam of light.

The aforementioned copending U.S. patent application Ser. No. 808,224, filed on June 20, 1977, discloses the use of a single crystal high resistivity substrate which is photosensitive under AC excitation to generate charge and then transfer it under the influence of an AC electric field across the substrate which is depleted of its mobile charge carriers during one portion of the AC bias cycle. The means for depleting the substrate of its mobile charge carriers during a part of the bias cycle is an MOS type of a capacitor formed on a surface of the substrate. The transverse and spatially uniform electric field of the totally depleted MOS capacitor is used to collect photogenerated minority carriers and to provide a spatial resolution by means of field focusing during the depletion phase of the applied AC voltage.

The aforementioned copending U.S. patent application Ser. No. 834,856, filed on Sept. 9, 1977, discloses the use of a conducting microgrid in a portion of an AC liquid crystal light valve semiconductor substrate. This microgrid is a microchannel grid structure which is formed in a predetermined portion of the substrate and has the same type of conductivity as the bulk substrate except it has a higher conductivity. When the substrate is depleted of its mobile charge carriers during a portion of the AC cycle this microgrid is also depleted of its charge carriers and is left with a high concentration of immobile charge carriers of the same polarity as the minority charge carriers of the substrate. When the signal-representing charge carriers move through the substrate they are repelled by these immobile charge carriers of the microgrid towards the center of the light valve cell. Thus, this microgrid focuses the signal charges and improves the resolution of the light valve.

The inventions disclosed and claimed in the aforementioned patent applications and patents represent truly significant advances in this art as explained in detail in said application. Our present invention extends the developments in this area of technology and provides an AC light valve with an alternate readout structure.

THE INVENTION

The general purpose of this invention is to provide an alternating current liquid crystal light valve with an improved signal charge readout structure. More specifically, this invention provides a structure which can be photoactivated or receive signal representing charge carriers from a CCD or any other source and convert these charge carriers into an AC signal that will activate the liquid crystal layer. Signals are transferred from one side of a substrate to the other with a high collection efficiency and with good spatial resolution.

To accomplish this purpose, we have provided an alternating current driven liquid crystal light valve which includes in combination an AC activated liquid crystal layer, interface means next to the liquid crystal layer for optically isolating it from the remaining portion of the structure and a light valve substrate. The light valve substrate includes a dielectric layer which is adjacent the interface means and a semiconductor body of predetermined thickness and conductivity adjacent the dielectric layer. In the semiconductor body there is a diode structure adjacent the dielectric layer. There are also provided means for applying across the light valve substrate an AC biasing electric field which depletes the semiconductor body of mobile charge carriers during a portion of the AC cycle whereby signal-representing charge carriers in the semiconductor body move when it is depleted of mobile charge carriers under the influence of the electric field.

In one preferred embodiment of the invention, the semiconductor body can be silicon with a high resistivity so that it can be fully depleted of its mobile charge carriers with a relatively low voltage. The dielectric layer can then be silicon dioxide thus forming in combination with the silicon body an MOS type capacitor. An AC bias voltage applies a forward bias on the diode structure during a portion of the cycle and charges this capacitor. During the remaining part of the cycle the applied voltage becomes zero and the capacitor causes the reverse biasing of the diode structure creating a depletion region that extends throughout the entire bulk silicon body including at least a portion of the diode structure. Photogenerated minority charge carriers in the silicon body or minority charge carriers read out of an adjacent CCD or from any other source move within this body towards the MOS capacitor. While there, the charge carriers will attract opposite polarity charge carriers on the other side of the dielectric. These opposite polarity carriers are introduced through an electrode adjacent the liquid crystal layer and pass through the liquid crystal layer activating it and then through the interface layers reach the dielectric layer.

The diode structure can be a set of discrete diodes formed in a portion of the semiconductor body adjacent the dielectric layer. For example, they can be made by forming a set of island type regions on this semiconductor body of a conductivity opposite to that of the semiconductor body. When the semiconductor body is depleted of all mobile charge carriers, because of the reverse biasing of these diodes, these small islands of opposite conductivity material may be partially or totally depleted of their mobile charge carriers. In any event there will be in these islands a large number of immobile charge carriers that will have an opposite polarity to the minority charge carriers of the bulk portion of the semiconductor body. These immobile charge carriers will attract towards the islands the signal representing minority charge carriers of the semiconductor body and thus they will focus the signal carriers, improving the spatial resolution of the structure. A grid of a dielectric material may be formed between these discrete diodes in order to decrease the interdiode capacitance and thereby reduce the dark current in the areas surrounding the individual diode structure.

One advantage of the present invention is that it uses a depleted semiconductor body to move signal-representing charge carriers towards a liquid crystal or some other light modulated display medium. Inside the charge depleted body, the charge carriers are field guided and, therefore, move while maintaining their spatial resolution.

Another advantage is that it uses a diode structure to deplete the semiconductor body of the mobile charge carriers and then the same diode structure is used to focus the charge carriers and improve the spatial resolution of the signals.

Another advantage of the present invention is that the light valve is AC driven which results in an improved electrochemical stability for the liquid crystal material.

Accordingly, it is an object of the present invention to provide an AC liquid crystal light valve with an improved charge readout structure for the generation and transfer of signal representing charge carriers that cause the activation of a liquid crystal layer.

It is another object of the present invention to provide an AC liquid crystal light valve which includes a charge transfer medium that can be used to transfer many signals at high frequencies while maintaining their spatial resolution.

It is another object of the present invention to provide a light valve with a diode structure in the transfer medium to deplete the transfer medium of mobile charge carriers, to set up an electric field to move the carriers and to provide centers for the attraction and retention of these carriers for an improved resolution of the transmitted signals.

It is yet another object of the present invention to provide an AC liquid crystal light valve with a wide spectral range of photosensitivity.

These and other objects of the invention will become more fully apparent in the following description of the accompanying drawings.

DETAILED DESCRIPTION OF THE DRAWINGS

Figure 1:
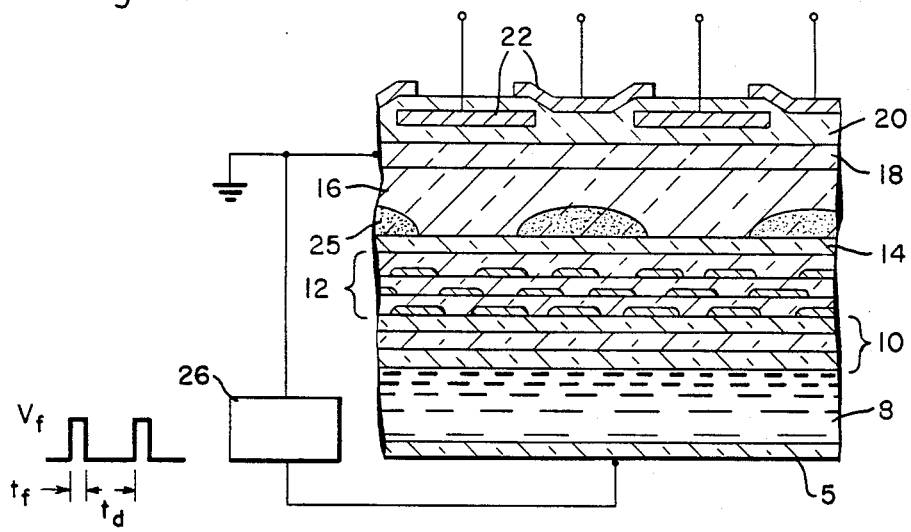
FIG. 1 is a diagrammatic cross-sectional view of a CCD driven MOS silicon liquid crystal light valve with a diode structure constructed in accordance with the present invention.

Referring now to FIG. 1, there is shown a diagrammatic cross-sectional view of a CCD driven liquid crystal light valve. It receives a DC signal from the CCD and converts it into an AC signal (zero average charge) that activates the liquid crystal. It includes a transparent electrode 5, a liquid crystal layer 8, a multilayer mirror 10, light blocking layers 12, a silicon dioxide layer (SiO$_2$) 14, a high resistivity silicon (Si) wafer 16, a silicon epitaxial layer 18, a silicon dioxide layer 20, and a set of CCD electrodes 22. The combination of the multilayer mirror 10, which can, for example, be made up from SiO$_2$/TiO$_2$ layers, and the light blocking layers 12, which are Cermet layers made up of alternating metallic particles and dielectric layers, make up an interface means for the optical isolation of the liquid crystal from the light valve substrate and the CCD. In the high resistivity silicon 16, or silicon substrate as sometimes it is referred to, there is a set of island-like doped regions 25 with a conductivity type opposite to that of the remaining portion of the silicon substrate thus forming a set of PN diodes with the substrate. Although this structure will be described with a P-type silicon substrate, the invention is equally applicable with devices constructed with N-type silicon substrates or substrates from other semiconductor materials using any type of conductivity determining impurity. In one particular example, the silicon substrate was P-type with a <100> crystalographic orientation. The resistivity of the substrate can vary although for better resolution it would be preferable to be over 1 kΩ-cm. The wafer can be polished down to a thickness between 3 and 10 mils, the value of which is to be determined by the silicon resistivity and the available depletion voltage. Therefore, the wafer can have a thickness which is lower or higher than the ones stated above. Since this is a high resistivity P-type material it is sometimes referred to as $\pi$-type Si. An AC power supply 26 is applied between transparent electrode 5 and the epitaxial layer 18.

During operation a CCD input register accepts serial input data, stores it and reformats it in subsequent parallel processing. This is done, for example, by having the CCD serial input register accept one line of information after it is filled, the information is transferred in parallel into a CCD parallel array. Next the serial register is filled with a new line of information while the first line of information is being shifted one step upward in the parallel array. Then the second line of information is transferred from the serial register into the first stage of the parallel array. The same process is repeated until the parallel array contains an entire frame of information. Then the entire frame of information is transferred simultaneously through the readout structure for a temporary storage into the liquid crystal layer where it may be used to spatially modulate a laser readout beam. The readout structure operates in an AC mode using an insulating SiO$_2$ layer to prevent an DC current component from flowing through the structure. Therefore, this readout structure electrically functions like an MOS capacitor. During a portion $t_f$ of the cycle, a negative pulse V of a predetermined value is applied on the transparent electrode 5 while the epitaxial layer is grounded. This makes the diode structure (represented by substrate 16 and regions 25) forward biased and current flows through it which permits the charging of the MOS capacitor by depositing positive charges in the Si/SiO$_2$ interface, and causing negative charges to flow through the liquid crystal to deposit on the other side of the interface layers (14). During the remaining portion $t_d$ of the AC cycle the transparent electrodes are grounded and the capacitor in its attempt to discharge reverse biases the diode structure creating a depletion region throughout the $\pi$ region of substrate 16, a portion of the epitaxial layer 18 and a portion of the n regions 25. During this time ($t_d$) minority charge carriers, which are electrons in this case, are released from the control of the CCD electrodes (22) and are allowed to diffuse through a portion of the epitaxial layer (18) and they are then swept by the electric field across the depleted portion of the epitaxial layer, and the entire thickness of the $\pi$-type substrate and reach the Si/SiO$_2$ interface where some of them will recombine with the immobile positive charged ions created there during the charging of the capacitor in the n regions 25 during the prior portion of the AC cycle. This recombination forces the neutralizing of some of the opposite polarity charges on the other side of the dielectric layer (16) creating again the flow of current through the liquid crystal layer, and thus activating it. While the signal-representing electrons in the $\pi$ region (16) move towards the Si/SiO$_2$ interface they are attracted into the n regions 25 which, because of the reverse biasing of the diodes, are left with a high concentration of immobile positive ions. Thus the signal-representing electrons are focused into these island-like regions thus providing an enhancement in the spatial resolution of the signals. The power supply frequency is preselected to be the same as the frame frequency.

The other layers such as the interface layers 10 and 12 and their effect on the operation on AC coupled liquid crystal light valves has been explained in the specification of the aforementioned copending U.S. patent application Ser. No. 808,224 by the same inventors as the present application and those explanations are hereby incorporated into this application by reference.

Figure 2:
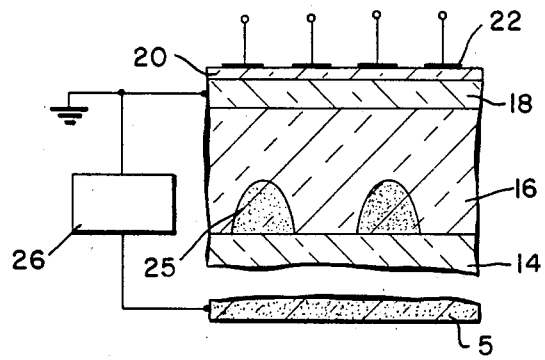
FIG. 2 is a diagrammatic cross-sectional view of a portion of the light valve shown in FIG. 1, that includes the light valve substrate with the CCD that provides the activating input signals and the discrete diodes for creating a charge depletion region in the substrate.

Referring now to FIG. 2, there is shown a diagrammatic cross-sectional view of a portion of the light valve shown in FIG. 1, that includes the light valve substrate with a CCD structure that provides the activating input signals. This light valve portion includes a high resistivity $\pi$-type Si wafer 16 with an $SiO_2$ layer 14 on one side and a P-type Si epitaxial layer 18 on the other. Next to the epitaxial layer 18 there is an $SiO_2$ layer 20 on which there are CCD electrodes 22. A power supply 26 is connected across the epitaxial layer 18 and a transparent electrode 5. Regions 25 form a set of PN junctions with wafer 16.

Figure 3:
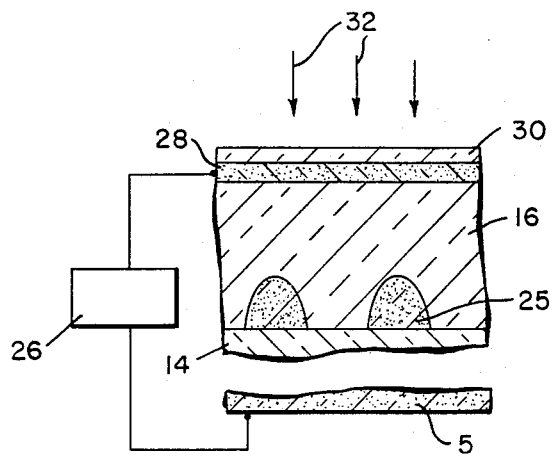
FIG. 3 is a diagrammatic cross-sectional view of a portion of a photoactivated liquid crystal light valve that includes a light valve substrate that can be reached by a light input and again the discrete diodes.

Referring now to FIG. 3, there is shown a diagrammatic cross-sectional view of a portion of a light valve that is photoactivated. It includes a high resistivity $\pi$-type silicon substrate 16 on one side of which there is an $SiO_2$ layer 14 and in the substrate adjacent the $SiO_2$ layer there are regions 25 that form a set of PN junctions with wafer 16. On the other side of the substrate there is a transparent electrode 28 which is formed by the heavy doping (P+ region) of a relatively thin portion of the substrate with a P-type impurity and adjacent to electrode 28 there is thin transparent $SiO_2$ layer 30. A power supply 26 is connected between transparent electrode 5 and transparent back electrode 28. Writing light 32 penetrates through the $SiO_2$ and P+ layers 30 and 28 respectively and reaches to the $\pi$-type silicon substrate 16 which is sensitive to the received radiation. In all other respects the operation of a photoactivated liquid crystal light valve is similar to the CCD drive liquid crystal light valve.

Figure 4A:
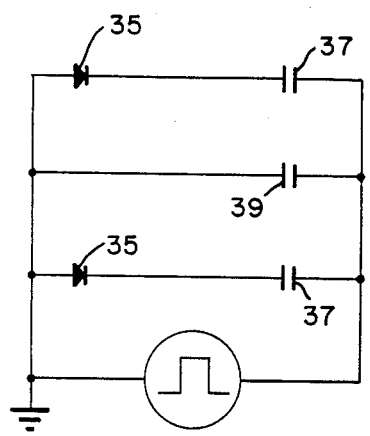
FIGS. 4a and 4b are equivalent circuits for a structure such as that depicted in FIG. 2 or FIG. 3 during the two portions of the bias cycle.
Figure 4B:
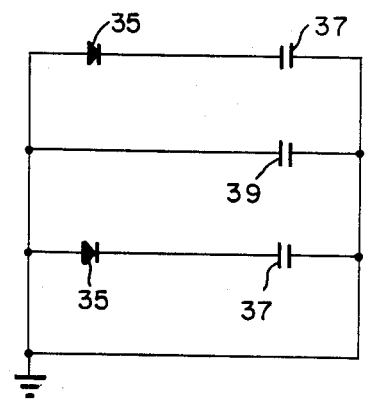
Figure 5:
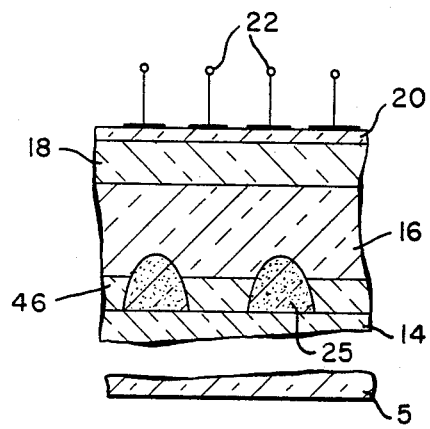
FIG. 5 is a diagrammatic cross-sectional view of a structure similar to that of FIG. 2 with the discrete diodes insulated by a dielectric grid.
Figure 6:
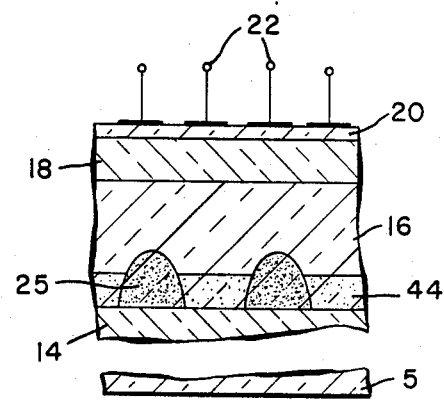
FIG. 6 is a diagrammatic cross-sectional view of a structure similar to that of FIG. 5 except instead of the SiO$_2$ grid there is in its place a lightly doped region of opposite conductivity type to that of the semiconductor body.

Referring now to FIGS. 4a and 4b, there are shown therein equivalent circuits for the structure shown in either FIG. 2 or FIG. 3. FIG. 4a shows the equivalent circuit of the AC biased light valve substrate, for the time duration ($t_f$) when the positive pulse $V_f$ is "on". Each of the two diodes shown in FIG. 2 (formed by the two N+ regions and the $\pi$ region are represented by the two parallel diodes 35 of FIG. 4a. The capacitances due to the $SiO_2$ layer adjacent the two N+ regions 25 are represented in the equivalent circuit by capacitors 37 which are in series with diodes 35. Capacitor 39 represents the capacitance of the $SiO_2$ layer in the $\pi$ regions adjacent to and between the proximity of the N+ regions 25. When the bias voltage goes to zero during the $t_d$ portion of the AC cycle, the equivalent circuit becomes like that shown in FIG. 4b. Diodes 35 are reverse biased by the voltage across capacitors 37. In the absence of any input signal the only current flowing through the short circuit is that created by the discharge of capacitor 39. This is referred to as "dark current" and is a form of a noise current which is undesirable because it is superimposed on the signal current and reduces the sensitivity of the device. In order to reduce this current it is necessary to reduce the capacitance 39. To accomplish this, it is necessary to increase its effective dielectric thickness, FIGS. 5 and 6 show two different ways of achieving this. In FIG. 5 there is shown a diagrammatic cross-sectional view of a structure similar to that of FIG. 2 which further includes a buried dielectric grid 46 in wafer 16 to render the value of capacitance 39 much smaller than capacitance 37, thereby reducing the transient current through this path. This buried grid 46 may be an $SiO_2$ layer formed by locally oxidizing the silicon body and this is followed by a chemo-mechanical polish to restore the optical qualities of a flat wafer surface. This local oxidation can be accomplished in any one of several ways, such as for example:

(1) anodic oxidation (plasma or chemical) using a photoresist or a depositited $Al_2O_3$ mask both of which can be removed chemically; or (2) thermal oxidation using an etched $SiO_2$ mask which must be removed mechanically; or (3) ion implantation of oxygen into the grid regions followed by a high temperature oxidation in an inert environment.

After fabrication of the buried grid, the heavily doped N+ regions for each diode are incorporated into the cellular areas of $\pi$ silicon within the grid by gaseous diffusion or ion implantation or both. The grid itself may be used as a diffusion or implantation mask. The junction depth should be designed to reside below the depth of the buried oxide wells so that the deleterious effects of the $Si/SiO_2$ interface can be removed from the depletion electric field and thereby not contribute to the dark current. The doping density should be chosen to be high enough so that negligible depletion on the N+ side of the $\pi$/N+ junction occurs and so that the diffusion current contribution to the total dark current is negligible in comparison with the generation component from the $\pi$ region.

An alternate approach for reducing the interdiode capacitance is included in the embodiment shown in FIG. 6. Instead of a dielectric layer between the N+ regions 25 there is an N region 44 wherein the N-type doping concentration in region 44 is substantially smaller than the doping concentration of region 25. The doping concentration in region 44 must be low enough so that during the depletion portion of the AC cycle the entire region 44 is fully depleted of mobile charge carriers providing for a charge depletion region that extends to the $Si/SiO_2$ intersection. The N+ regions 25 do not have to be fully depleted. This device operates very much like the structure of FIG. 1 and the signal representing electrons will be attracted towards regions 25 instead of 44 because regions 25 will have a much higher concentration of immobile positive ions.

While the invention has been described with preferred embodiments and test structures, it will be understood that the invention is not limited to those particular embodiments and structures. On the contrary, it is intended to cover all alternatives, modifications and equivalents, as may be included within the spirit and scope of the invention as defined by the appended claims.

What is claimed is:

1. An alternating current driven liquid crystal light valve for responding to applied information signals, said light valve including in combination:

(a) a liquid crystal layer;

(b) interface means adjacent said liquid crystal layer for reflecting light and for inhibiting the passage of light therethrough;

(c) a light valve substrate structure including a dielectric layer adjacent said interface means, a semiconductor body of predetermined thickness and a first type of conductivity adjacent said dielectric layer, and including in preselected portions of said semiconductor body regions of a second conductivity type forming with the first conductivity type portion of said semiconductor body a set of PN junction diodes adjacent said dielectric layer; and (d) means for applying an AC biasing voltage across said light valve substrate, said interface means and said liquid crystal layer to cause the reverse biasing of said PN junctions during a portion of the AC cycle establishing depletion regions that extend throughout the thickness of said first conductivity type portion and at least portions of said second type conductivity regions establishing an electric field in said semiconductor body and charged centers in said second conductivity regions whereby information signal-representing charge carriers in said semiconductor body which move through said depletion regions under the influence of said electric field are attracted towards said charged centers for an improved resolution of the signals applied across said liquid crystal layer.

2. A liquid crystal light valve as set forth in claim 1 wherein:
 (a) said dielectric layer is silicon dioxide;
 (b) said semiconductor body is silicon; and
 (c) said means for applying an AC electric field across said light valve substrate is a set of electrodes, one adjacent said liquid crystal layer and one adjacent said semiconductor body.

3. A liquid crystal light valve as set forth in claim 1 which further includes a buried dielectric grid in said semiconductor body to isolate said second conductivity type regions from each other.

4. An alternating current driven liquid crystal light valve having a liquid crystal layer, a light valve substrate and interface means between said liquid crystal layer and said light valve substrate for optically isolating said substrate from said liquid crystal layer and for reflecting any light that passes through said liquid crystal layer characterized in that said light valve substrate comprises:
 (a) a semiconductor body of predetermined thickness and a first type of conductivity;
 (b) a dielectric layer between said semiconductor body and said interface means;
 (c) a set of second conductivity regions formed in predetermined sections of said semiconductor body, and disposed adjacent said dielectric layer, forming with the remaining portion of said semiconductor body a set of PN junction diodes; and
 (d) means for applying an AC electric field across said light valve whereby said PN junctions are forward biased during a portion of the AC cycle causing signal representing charge carriers in said semiconductor body to move towards the semiconductor body-dielectric layer interface and these charge carriers cause the reverse biasing of said PN junctions during the remaining portion of the AC cycle establishing depletion regions in said semiconductor body through which signal representing charge carriers move towards the semiconductor body-dielectric layer interface while being attracted and focused towards the portions of said interface adjacent said second conductivity regions to provide an improved resolution for the electric signals applied across said liquid crystal layer.

5. A liquid crystal light valve as set forth in claim 4 wherein:
 (a) said semiconductor body is silicon; and
 (b) said dielectric layer is silicon dioxide.

6. A liquid crystal light valve as set forth in claim 5 which further includes dielectric means for insulating said PN junctions from each other.

7. A liquid crystal light valve as set forth in claim 4, which further includes an additional second conductivity layer around said second conductivity regions wherein said second conductivity layer has a lower absolute conductivity than said second conductivity regions, so that said second conductivity layer is fully depleted of its majority mobile charge carriers up to said interface during the time the said PN junctions are reverse biased.

8. A liquid crystal light valve adapted to be driven by a bias voltage alternating between two preselected levels comprising a liquid crystal layer, associated interface layers including dielectric mirrors and light blocking layers, a light valve substrate structure including a dielectric layer adjacent said interface layers, a semiconductor body adjacent said dielectric layer and an electrode arrangement for applying said voltage across said light valve wherein said dielectric layer, said semiconductor body and said electrode arrangement form an MOS capacitor type structure, and wherein the improvement comprises said light valve including a set of PN junction diodes in said semiconductor body and adjacent said dielectric layer arranged so that when said bias voltage is at a first preselected layer said diodes are forward biased allowing current to flow towards the semiconductor body—dielectric layer interface charging said MOS capacitor and when said bias voltage is at a second preselected voltage said capacitor in attempting to discharge reverse biases said diodes which in turn causes the depletion of said semiconductor body of mobile charge carriers whereby when signal representing charge carriers are introduced in said semiconductor body they are transferred across said body to reach the semiconductor dielectric layer interface where they will be attracted and focused in the regions of said interface that are adjacent said diodes.

9. A light valve according to claim 8, which further includes a buried dielectric grid in the semiconductor body to isolate said diodes and reduce the interdiode capacitance of the structure.

10. A light valve according to claim 8, which further includes an additional layer in said semiconductor body of the same conductivity type but substantially lower conductivity than said diode regions adjacent said dielectric layer for reducing the interdiode capacitance of the structure.

11. A light valve according to claim 8, wherein said semiconductor body is photosensitive to incoming radiation.

12. A light valve according to claim 8, which further includes:
 (a) an epitaxial layer on a surface of said semiconductor body opposite said dielectric layer; and
 (b) a charge coupled device (CCD) arrangement constructed on said epitaxial layer including a dielectric layer and the associated charge coupled electrodes whereby said CCD is used to introduce into said epitaxial layer charge carriers for transfer at the appropriate time to the MOS capacitor.

13. A liquid crystal light valve of the type having a photoactivated semiconductor substrate, a liquid crystal layer and an interface structure comprising a light blocking arrangement and a mirror arrangement between said substrate and said liquid crystal layer and adapted to have said liquid crystal layer alternating current (AC)—coupled to said substrate to prevent DC current components from flowing through said liquid crystal layer during operation, the improvement comprises having a dielectric layer between said substrate and said interface structure, and a set of discrete PN junction diodes formed in said substrate and adjacent said dielectric layer and biasing means for causing the reverse biasing of said PN junction diodes and the creation of depletion regions in said semiconductor substrate and fixed charge carriers in portions of said diodes adjacent said dielectric layer whereby signal representing charge carriers in said substrate move through said depletion regions towards said dielectric layer and are attracted and focused by said fixed charged carriers adjacent said dielectric layer.

14. A liquid crystal light valve of the type having a semiconductor substrate, a liquid crystal layer and an interface structure comprising a light blocking arrangement and a mirror arrangement between said substrate and said liquid crystal layer and adapted to have said liquid crystal layer alternating current (AC)—coupled to said substrate to prevent DC current components from flowing through said liquid crystal layer during operation, the improvement comprises having an epitaxial layer adjacent said substrate on which there is a charge coupled device (CCD) structure adapted for providing input signals to the light valve; a dielectric layer adjacent said substrate and opposite said epitaxial layer and between said substrate and said interface structure; and a set of discrete PN junction diodes formed in said substrate and adjacent said dielectric layer; and biasing means for causing the reverse biasing of said PN junction diodes and the creation of depletion regions in said semiconductor substrate and fixed charge carriers in portions of said PN junctions adjacent said dielectric layer so that signal representing charge carriers brought into the light valve through said CCD structure pass through said depletion regions towards said dielectric layer and are attracted and focused by said fixed charge carriers adjacent said dielectric layer.

* * * * *